United States Patent
Karakawa et al.

(10) Patent No.: US 10,626,496 B2
(45) Date of Patent: Apr. 21, 2020

(54) FILM FORMING APPARATUS, METHOD OF CLEANING FILM FORMING APPARATUS, AND STORAGE MEDIUM

(71) Applicant: TOKYO ELECTRON LIMITED, Tokyo (JP)

(72) Inventors: Takayuki Karakawa, Nirasaki (JP); Jun Ogawa, Nirasaki (JP); Noriaki Fukiage, Nirasaki (JP); Yasuo Kobayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/001,556

(22) Filed: Jun. 6, 2018

(65) Prior Publication Data

US 2018/0355479 A1 Dec. 13, 2018

(30) Foreign Application Priority Data

Jun. 13, 2017 (JP) ................................ 2017-116186

(51) Int. Cl.
*C23C 16/44* (2006.01)
*C23C 16/455* (2006.01)
(Continued)

(52) U.S. Cl.
CPC ...... *C23C 16/4405* (2013.01); *C23C 16/4584* (2013.01); *C23C 16/45536* (2013.01);
(Continued)

(58) Field of Classification Search
CPC .......... C23C 16/4405; C23C 16/45536; C23C 16/45544; C23C 16/4584; H01L 21/0217;
(Continued)

(56) References Cited

U.S. PATENT DOCUMENTS

| 2014/0179104 A1* | 6/2014 | Oshimo ............ H01L 21/68771 438/680 |
| 2015/0232986 A1* | 8/2015 | Kameda .............. C23C 16/4405 438/758 |

(Continued)

FOREIGN PATENT DOCUMENTS

JP 4987911 A 8/2012

*Primary Examiner* — Fernando L Toledo
*Assistant Examiner* — Neil R Prasad
(74) *Attorney, Agent, or Firm* — Nath, Goldberg & Meyer; Jerald L. Meyer (57) ABSTRACT

A film forming apparatus is provided for forming a film by revolving a substrate placed on a rotary table in a vacuum container, alternately supplying a precursor gas and a reaction gas that reacts with the precursor gas to generate a reaction product multiple times, and depositing the reaction product on the substrate. The film forming apparatus comprises a precursor gas supply region that supplies the precursor gas onto the substrate, one or more plasma generation regions that generate plasma at a position apart from the precursor gas supply region in a rotational direction of the rotary table, and a cleaning region that cleans the rotary table by supplying a cleaning gas onto the rotary table in a region apart from the plasma generation regions and the precursor gas supply region in the rotational direction when a film forming process is not performed on the substrate.

10 Claims, 11 Drawing Sheets

(51) Int. Cl.
*H01L 21/67* (2006.01)
*H01L 21/02* (2006.01)
*C23C 16/458* (2006.01)
*H01L 21/687* (2006.01)
*C23C 16/511* (2006.01)

(52) U.S. Cl.
CPC .. *C23C 16/45542* (2013.01); *C23C 16/45544* (2013.01); *C23C 16/45551* (2013.01); *C23C 16/511* (2013.01); *H01L 21/0217* (2013.01); *H01L 21/0228* (2013.01); *H01L 21/02211* (2013.01); *H01L 21/02274* (2013.01); *H01L 21/67028* (2013.01); *H01L 21/68764* (2013.01); *H01L 21/68771* (2013.01)

(58) Field of Classification Search
CPC ........... H01L 21/0228; H01L 21/67028; H01L 21/68764; H01L 21/68771
See application file for complete search history.

(56) References Cited

U.S. PATENT DOCUMENTS

2015/0368794 A1* 12/2015 Morita .................... C23C 16/22
                                                              156/345.24
2016/0284532 A1*  9/2016 Ueda ................ H01L 21/02164
2017/0087606 A1*  3/2017 Nakamura .......... C23C 16/4412

* cited by examiner

FILM FORMING APPARATUS, METHOD OF CLEANING FILM FORMING APPARATUS, AND STORAGE MEDIUM

CROSS-REFERENCE TO RELATED APPLICATION

This application is based upon and claims the benefit of priority from Japanese Patent Application No. 2017-116186, filed on Jun. 13, 2017, the entire contents of which are incorporated herein by reference.

TECHNICAL FIELD

The present disclosure relates to a technique for cleaning a film forming apparatus.

BACKGROUND in a process of manufacturing a semiconductor device, various films such as a $Si_3N_4$ (hereinafter referred to as silicon nitride or SiN) film and so on are formed on a semiconductor wafer (hereinafter referred simply to as a wafer) as a substrate. This film forming process is carried out by a method called ALD (Atomic Layer Deposition), for example, by alternately supplying a precursor gas and a reaction gas onto the wafer multiple times. As a film forming apparatus for performing ALD, an apparatus is known in which a wafer is placed on a rotary table installed in a vacuum container, and the wafer which is revolved by rotation of the rotary table passes repeatedly through an atmosphere to which a precursor gas is supplied and an atmosphere to which a reaction gas is supplied. In addition to supplying the precursor gas atmosphere and the reaction gas atmosphere, there is a case where a modifying gas for modifying a film is supplied onto the rotary table and a plasma generation mechanism, for plasmarizing the reaction gas and the modifying gas in predetermined regions in which the reaction gas and the modifying gas are respectively supplied, is installed.

In the above-mentioned film forming apparatus, since the precursor gas and the gas are also supplied onto the rotary table in addition to the wafer, a film is also formed on the rotary table. Therefore, when a film forming process is not performed, a cleaning gas is supplied into the vacuum container to perform a cleaning process for removing the film on the rotary table. A technique for preventing corrosion of a processing container by a gas containing a halogen element is also known.

In the above-mentioned film forming apparatus, a nitrogen trifluoride ($NF_3$) gas is supplied as the cleaning gas to a region to which the reaction gas and the modifying gas are supplied during the film forming process, and the $NF_3$ gas is converted into plasma by the plasma generation mechanism to carry out cleaning. After completion of the cleaning process, when a SiN film formed with the same process conditions as before the cleaning process, it is found that the film thickness and the film quality of the SiN film are lower than those of a SiN film formed immediately before the cleaning process.

The SiN film formed after the cleaning process contains more fluorine (F) than the SiN film formed immediately before the cleaning process. It is believed that this is because F constituting the plasmarized cleaning gas is doped in the ceiling plate of the vacuum container and is mixed into the SiN film from the ceiling plate during the film forming process. However, a method for coping with the problem that components constituting the cleaning gas remain in the vacuum container in this way is unknown.

SUMMARY

Some embodiments of the present disclosure provide a technique for suppressing an effect of cleaning on a film forming process in a film forming apparatus for forming a film by supplying a gas onto a substrate that is placed and revolved on a rotary table.

According to one embodiment of the present disclosure, there is provided a film forming apparatus for forming a film by revolving a substrate placed on a rotary table in a vacuum container by means of the rotary table, alternately supplying a precursor gas and a reaction gas that reacts with the precursor gas to generate a reaction product multiple times, and depositing the reaction product on the substrate, the film forming apparatus including: a precursor gas supply region that supplies the precursor gas onto the substrate; one or more plasma generation regions that generate plasma at a position apart from the precursor gas supply region in a rotational direction of the rotary table; and a cleaning region that cleans the rotary table by supplying a cleaning gas onto the rotary table in a region apart from the plasma generation regions and the precursor gas supply region in the rotational direction when a film forming process is not performed on the substrate, wherein at least one of the plasma generation regions is a region that generates plasma by plasmarizing the reaction gas.

According to another embodiment of the present disclosure, there is provided a method of cleaning a film forming apparatus, including: forming a film by revolving a substrate placed on a rotary table in a vacuum container by means of the rotary table and repeating multiple times a step of adsorbing a precursor gas on the substrate by supplying the precursor gas onto the substrate in a precursor gas supply region and a step of processing the substrate in one or more plasma generation regions, wherein the plasma generation regions are apart from the precursor gas supply region in a rotational direction of the rotary table and the film comprises a reaction product generated by reaction of the precursor gas and a reaction gas; and removing the film by rotating the rotary table and supplying a cleaning gas onto the rotary table in a region apart from the plasma generation regions and the precursor gas supply region in the rotational direction, wherein at least one of the plasma generation regions is a region that generates plasma by plasmarizing the reaction gas.

According to another embodiment of the present disclosure, there is provided a non-transitory computer-readable storage medium storing a computer program used for a film forming apparatus for forming a film by revolving a substrate placed on a rotary table in a vacuum container by means of the rotary table, alternately supplying a precursor gas and a reaction gas that reacts with the precursor gas to generate a reaction product multiple times, and depositing the reaction product on the substrate, wherein the computer program s steps configured to perform the above-described method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 according to an embodiment of the present disclosure will be described with reference to a longitudinal sectional side view of FIG. 1, a cross sectional plan view of FIG. 2 and a schematic cross sectional plan view of FIG. 3. In this film forming apparatus 1, a film forming process of forming a SiN film the surface of a wafer W is performed by the above-described ALD and a modifying process of modifying the SiN film is performed in parallel to this film forming process. Further, when the film forming process is not performed, a cleaning process of removing a SiN film formed on a rotary table on which the wafer W is mounted during the film forming process is performed.

In the figures, reference numeral 11 denotes a flat, generally circular vacuum container (processing container), which is composed of a container main body 11A constituting a side wall and a bottom portion, and an upper member 11B. In the figures, reference numeral 12 denotes a circular rotary table installed horizontally in the vacuum container 11. In the figures, reference numeral 12A denotes a support part that supports the center portion of the back surface of the rotary table 12. In the figures, reference numeral 13 denotes a rotation mechanism which rotates the rotary table 12 clockwise in the circumferential direction when viewed from top through the support part 12A during the film forming process. In addition, X in FIG. 1 represents the rotation axis (rotation center) of the rotary table 12.

Six circular recesses 14 are formed on the upper surface of the rotary table 12 along the circumferential direction (rotational direction) of the rotary table 12 and the wafer W is received by each of the recesses 14. That is, each wafer W is mounted on the rotary table 12 so as to be revolved by the rotation of the rotary table 12. Reference numeral 15 in FIG. 1 denotes a plurality of heaters, which are installed concentrically at the bottom of the vacuum container 11, to heat the wafer W mounted on the rotary table 12. In FIG. 2, reference numeral 16 denotes a transfer port of the wafer W which is opened on the side wall of the vacuum container 11 and is configured to be opened/closed by a gate valve (not shown). Three lift pins (not shown) for holding the lower surface of the wafer W are installed on the lower side of the rotary table 12 in a region facing the transfer port 16 in the vacuum container 11 and holes through which the three lifting pins pass are formed at the bottom of each recess 14. When loading/unloading the wafer W, the rotary table 12 sequentially stops at a position where the holes of the recess and the lift pins overlap vertically, and the wafer W is delivered via the transfer port 16 between the outside of the vacuum container 11 and the inside of the recess 14 by cooperative action of a substrate transfer mechanism (not shown) and the lift pins.

On the rotary table 12 are arranged a gas supply/exhaust unit 2, a plasma formation unit 3A, a plasma formation unit 3B and a plasma formation unit 3C in this order along the rotational direction (clockwise in this example) of the rotary table 12 toward the downstream side. The gas supply/exhaust unit 2 is a unit that supplies a dichlorosilane (DCS) gas, which is a precursor gas used to form a SiN film, to the wafer W. The plasma formation units 3A to 3C are units for plasmarizing a plasma forming gas supplied onto the rotary table 12. The plasma formation unit 3C performs plasma treatment for nitriding the DCS gas adsorbed on the wafer W to form the SiN film. The plasma formation unit 3A performs plasma treatment for modifying the SiN film. The plasma formation unit 3B performs plasma treatment for the above-mentioned cleaning.

The configuration of the gas supply/exhaust unit 2 will be described below with reference to FIG. 4 which is a longitudinal sectional side view and also to FIG. 5 which is a bottom view. The gas supply/exhaust unit 2 is formed in a fan shape extending in the circumferential direction of the rotary table 12 from the central side of the rotary table 12 toward the peripheral side thereof when viewed from top, with the lower surface of the gas supply/exhaust unit 2 close to and facing the upper surface of the rotary table 12.

The gas supply/exhaust unit 2 is made of, for example, aluminum. A gas discharge port 21, an exhaust port 22 and a purge gas discharge port 23, which constitute a discharge part, are opened on the lower surface of the gas supply/exhaust unit 2. In FIG. 5, for the purpose of facilitating recognition, the exhaust port 22 and the purge gas discharge port 23 are indicated with a number of dots. A number of gas discharge ports 21 are arranged in a fan-like region 24 which is a side inner than the peripheral portion of the lower surface of the gas supply/exhaust unit 2. The gas discharge ports 21 discharge the DCS gas downward in a shower shape to supply it onto the entire surface of the wafer W during the rotation of the rotary table 12 in the film forming process.

In this fan-like region 24, three sections 24A, 24B and 24C are set from the central side of the rotary table 12 toward the peripheral side of the rotary table 12. The gas supply/exhaust unit 2 is provided with gas flow paths 25A, 25B and 25C partitioned from each other so that the DCS gas can be independently supplied to the gas discharge ports 21 provided in the respective sections 24A, 24B and 24C.

The downstream ends of the gas flow paths 25A, 25B and 25C are each configured as the gas discharge ports 21.

The respective upstream sides of the gas flow paths 25A, 25B and 25C are connected to a DCS gas supply source 26 via the respective, pipes, and a gas supply device 27 constituted by a valve and a mass flow controller is disposed in each of the pipes. The supply/stop and flow rate of the DCS gas supplied from the DCS gas supply source 26 to the downstream side in each of the gas flow paths 25A, 25B and 25C are controlled by the gas supply device 27. Each of the gas supply devices other than the gas supply device 27 to be described later is configured similarly to the gas supply device 27 and controls the supply/stop and flow rate of the gas to the downstream side.

Subsequently, the exhaust port 22 and the purge gas discharge port 23 will be described. The exhaust port 22 and the purge gas discharge port 23 are annularly opened at the peripheral portion of the lower surface of the gas supply/exhaust unit 2 so as to surround the fan-like region 24 (see FIG. 5) and to face the upper surface of the rotary table 12. The purge gas discharge port 23 is located outside the exhaust port 22. A region inside the exhaust port 22 on the rotary table 12 constitutes an adsorption region R0 which is a precursor gas supply region where DCS is adsorbed onto the surface of the wafer W. The purge gas discharge port 23 discharges a purge gas, for example, an argon (Ar) gas, onto the rotary table 12.

The discharge of the precursor gas from the gas discharge port 21, the exhaust from the exhaust port 22 and the discharge of the purge gas from the purge gas discharge port 23 are both performed together during the film forming process. Thereby, the precursor gas and the purge gas discharged toward the rotary table 12 as indicated by arrows in FIG. 4 are exhausted from the exhaust port 22 with the upper surface of the rotary table 12 facing the exhaust port 22. By performing the discharge and exhaust of the purge gas in this manner, the atmosphere of the adsorption region R0 is separated from the external atmosphere so that the precursor gas can be supplied to the adsorption region R0 in a limited manner. That is, it is possible to prevent the DCS gas supplied to the adsorption region R0 from being mixed with a gas and its active species supplied to the outside of the adsorption region R0, which will be described later. In this way, the gas supply/exhaust unit 2 constitutes a precursor gas supply part for supplying the precursor gas to the rotary table 12 and a separation mechanism for separating the internal atmosphere of the adsorption region R0 from the external atmosphere of the adsorption region R0.

Figure 4:
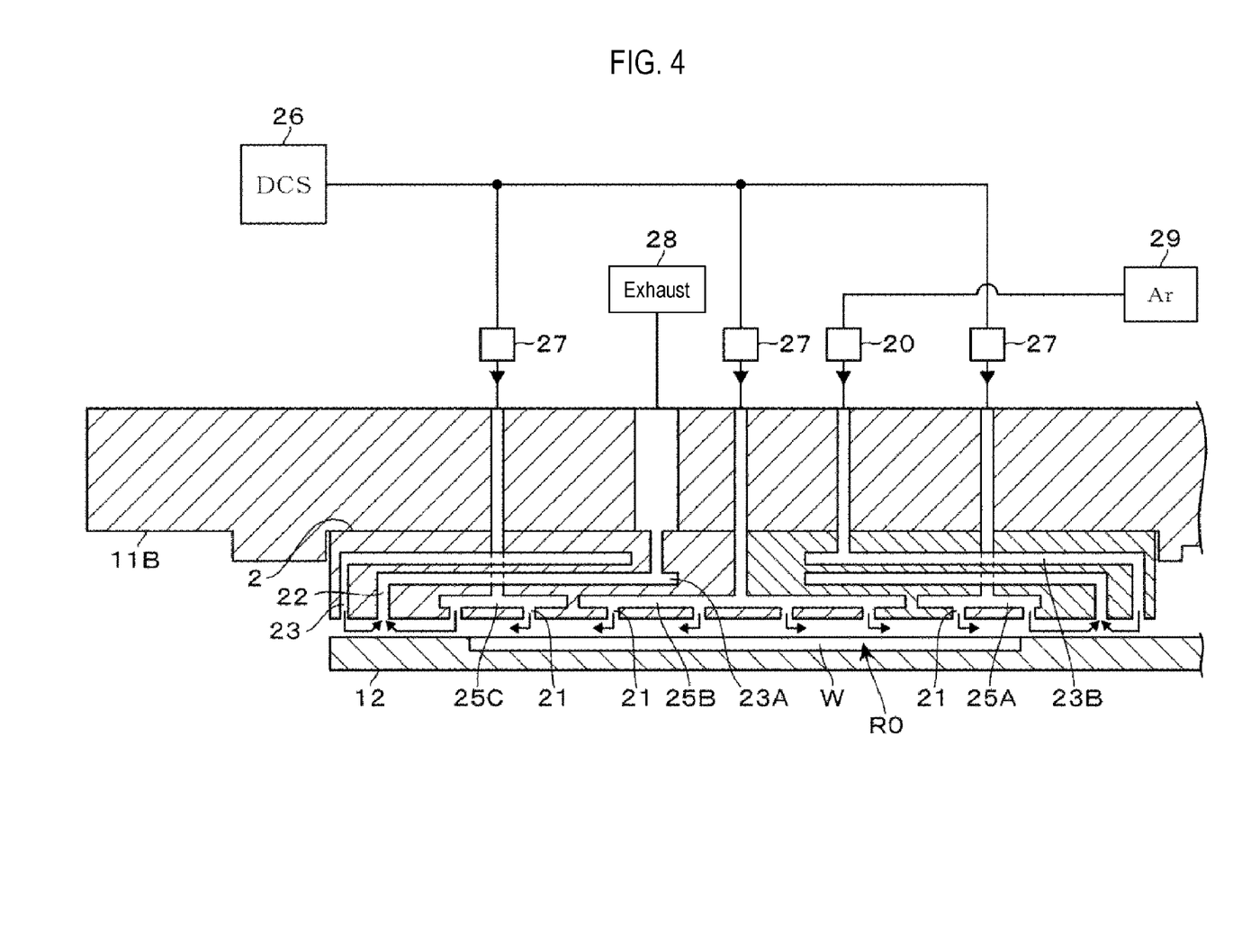
FIG. 4 is a longitudinal sectional side view of a gas shower head installed in the film forming apparatus.
Figure 5:
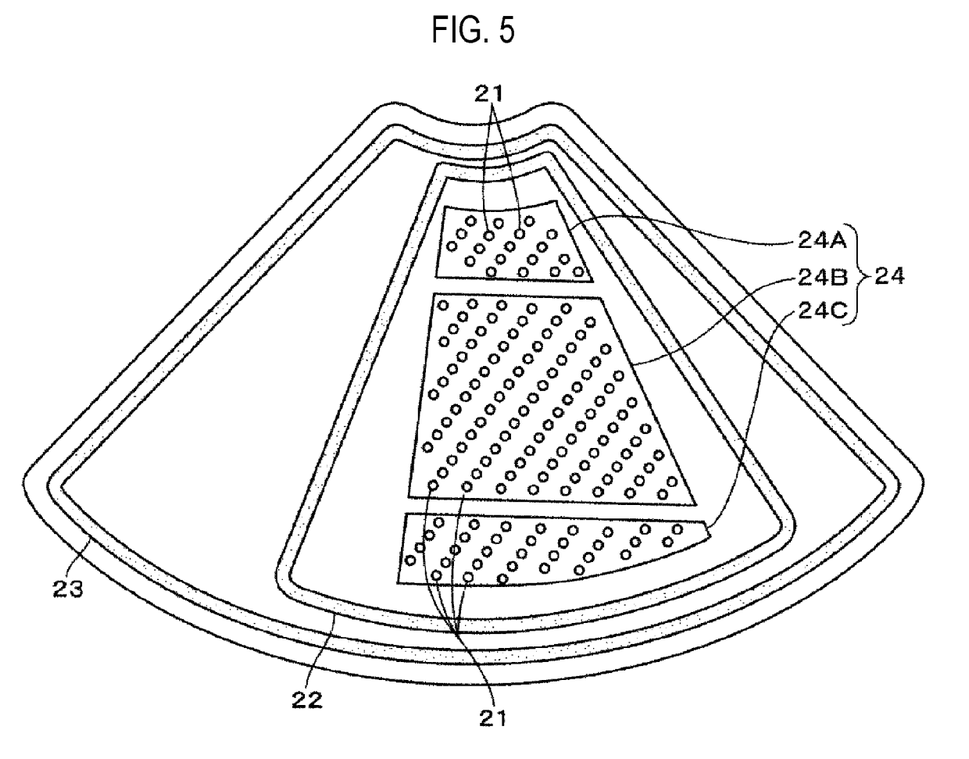
FIG. 5 is a bottom view of the gas shower head.

In FIG. 4, reference numerals 23A and 23B denote gas flow paths formed in the gas supply/exhaust unit 2, which are partitioned from each other and also partitioned from the flow paths 25A to 25C of the precursor gas. The upstream end of the gas flow path 23A is connected to the exhaust port 22 and the downstream end of the gas flow path 23A is connected to an exhaust device 28 that can perform exhaust from the exhaust port 22. The downstream end of the gas flow path 23B is connected to the purge gas discharge port 23 and the upstream end of the gas flow path 23B is connected to an Ar gas supply source 29. A gas supply device 20 is disposed on a pipe connecting the gas flow path 23B and the Ar gas supply source 29.

Returning to FIGS. 1 to 3, the plasma formation unit 3B will be described. The plasma formation unit 3B generates plasma on the rotary table 12 by supplying a gas for plasma formation onto the rotary table 12 and applying a microwave to this gas. The plasma formation unit 3B includes an antenna 31 for applying the microwave. The antenna 31 includes a dielectric plate 32 and a metal waveguide 33.

The dielectric plate 32 is formed in a fan shape which becomes wider from the central side to the peripheral side of the rotary table 12 when viewed from top. A fan-like through-hole is formed in the upper member 11B of the vacuum container 11 so as to correspond to the shape of the dielectric plate 32. The inner peripheral surface of the lower end portion of the through-hole slightly protrudes from the central portion side of the through-hole so as to form the support part 34. The dielectric plate 32 closes the through-hole from the upper side and is installed so as to face the rotary table 12; and the peripheral portion of the dielectric plate 32 is supported by the support part 34. That is, the dielectric plate 32 constitutes a ceiling plate of the vacuum container 11.

The waveguide 33 is installed on the dielectric plate 32 and has an internal space 35 extending above the upper member 11B. Reference numeral 36 in the figures denotes a slot plate constituting the lower side of the waveguide 33. The slot plate 36 is installed so as to be in contact with the dielectric plate 32 and has a plurality of slot holes 36A. An end portion of the waveguide 33 on the central side of the rotary table 12 is closed and a microwave generator 37 is connected to an end portion of the waveguide 33 on the peripheral side of the rotary table 12. The microwave generator 37 supplies a microwave of about 2.45 GHz to the waveguide 33. This microwave reaches the dielectric plate 32 through the slot holes 36A of the slot plate 36 and is supplied to a gas discharged below the dielectric plate 32 from a gas injector and a nozzle to be described later, thereby allowing plasma to be formed below the dielectric plate 32. In this manner, a fan-like region below the dielectric plate 32 forms a plasma generation region denoted by R2.

Figure 1:
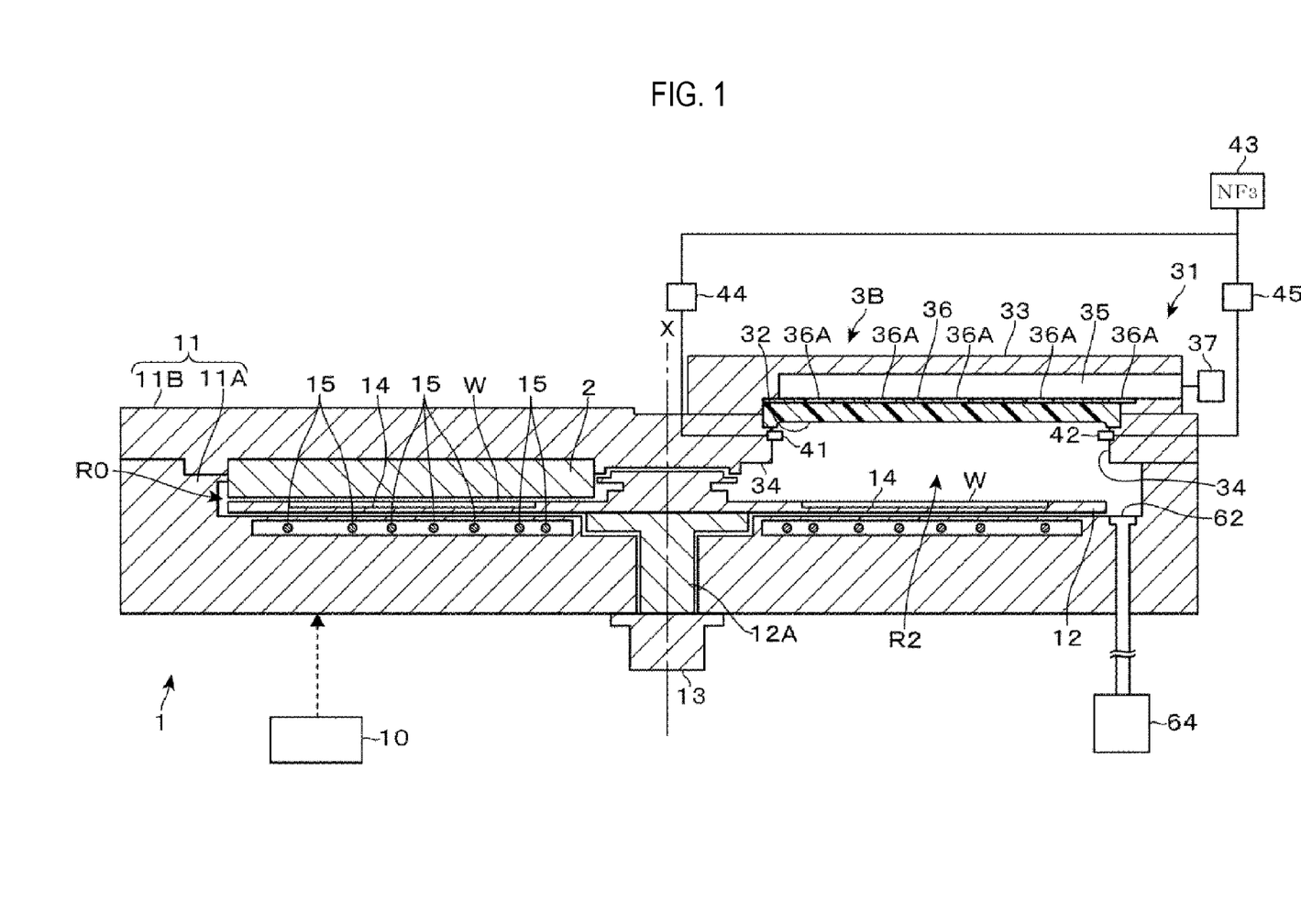
FIG. 1 is a longitudinal sectional side view of a film forming apparatus according to an embodiment of the present disclosure.
Figure 3:
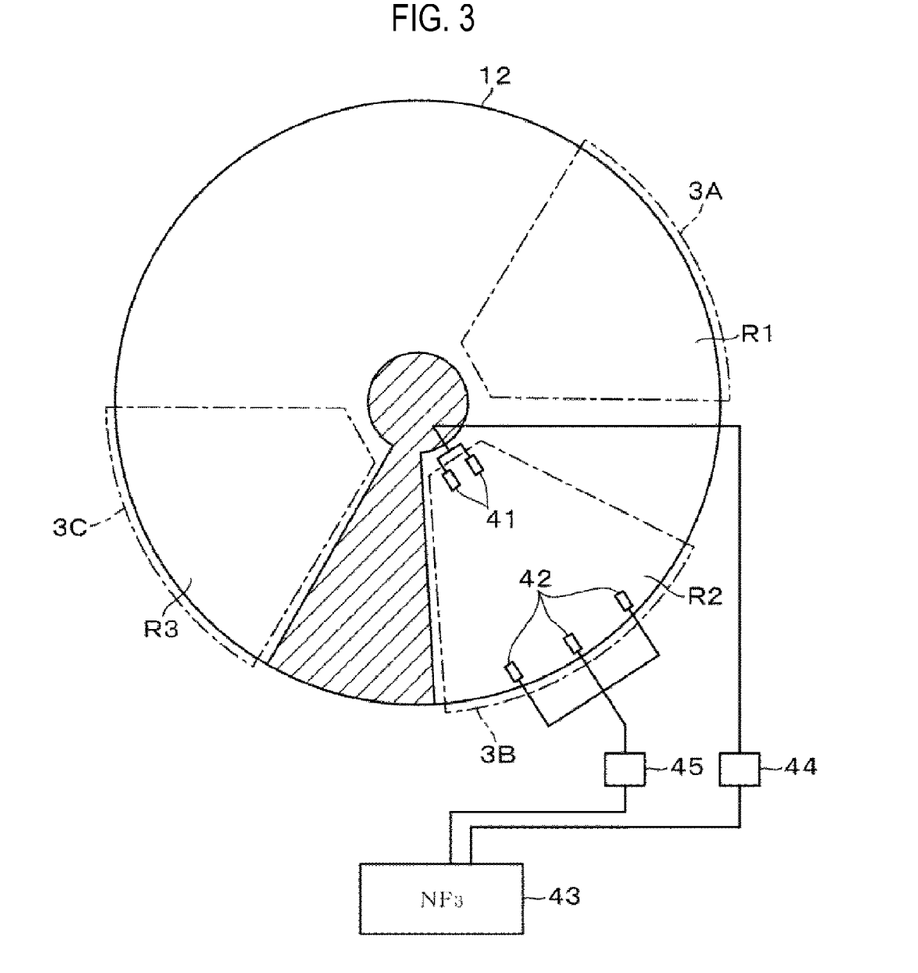
FIG. 3 is a schematic cross-sectional plan view of the film forming apparatus.

As shown in FIGS. 1 and 3, in the support part 34 (not shown in FIG. 3) of the plasma formation unit 3B, for example, two nozzles 41 are installed on the central side of the rotary table 12 in the circumferential direction of the rotary table 12. Each nozzle 41 is configured to discharge an $NF_3$ gas, which will be described later, horizontally to the peripheral side of the rotary table 12. In addition, for example, three nozzles 42 are installed on the peripheral side of the rotary table 12 in the support part 34 in the circumferential direction of the rotary table 12. Each nozzle 42 is configured to discharge the $NF_3$ gas horizontally to the central side of the rotary table 12.

In FIG. 3, reference numeral 43 denotes a supply source of $NF_3$ gas which is a cleaning gas. A gas supply device 44 is disposed in a pipe connecting the $NF_3$ gas supply source 43 and the nozzles 41, and a gas supply device 45 is disposed in a pipe connecting the $NF_3$ gas supply source 43 and the nozzles 42. In this example, the plasma generation region R2 corresponds to a cleaning region.

The plasma formation units 3A and 3C have the same configuration as the above-described plasma formation unit 3B. Regions in the plasma formation units 3A and 3C corresponding to the plasma generation region R2 are shown as plasma generation regions R1 and R3, respectively. Therefore, the plasma generation regions R1 to R3 are formed at different positions in the rotational direction of the rotary table 12. Then, plasma is individually formed in the plasma generation regions R1 R2 and R3 by microwaves supplied from the plasma formation units 3A, 3B and 3C. In other words, one of the plasma formation units 3A to 3C forms plasma in only one plasma generating region among the plasma generation regions R1 to R3 and forms no plasma in the other two plasma generation regions. Therefore, the plasma formation units 3A to 3C form plasma in the respective partial regions on the rotary table 12 in a limited manner.

Figure 2:
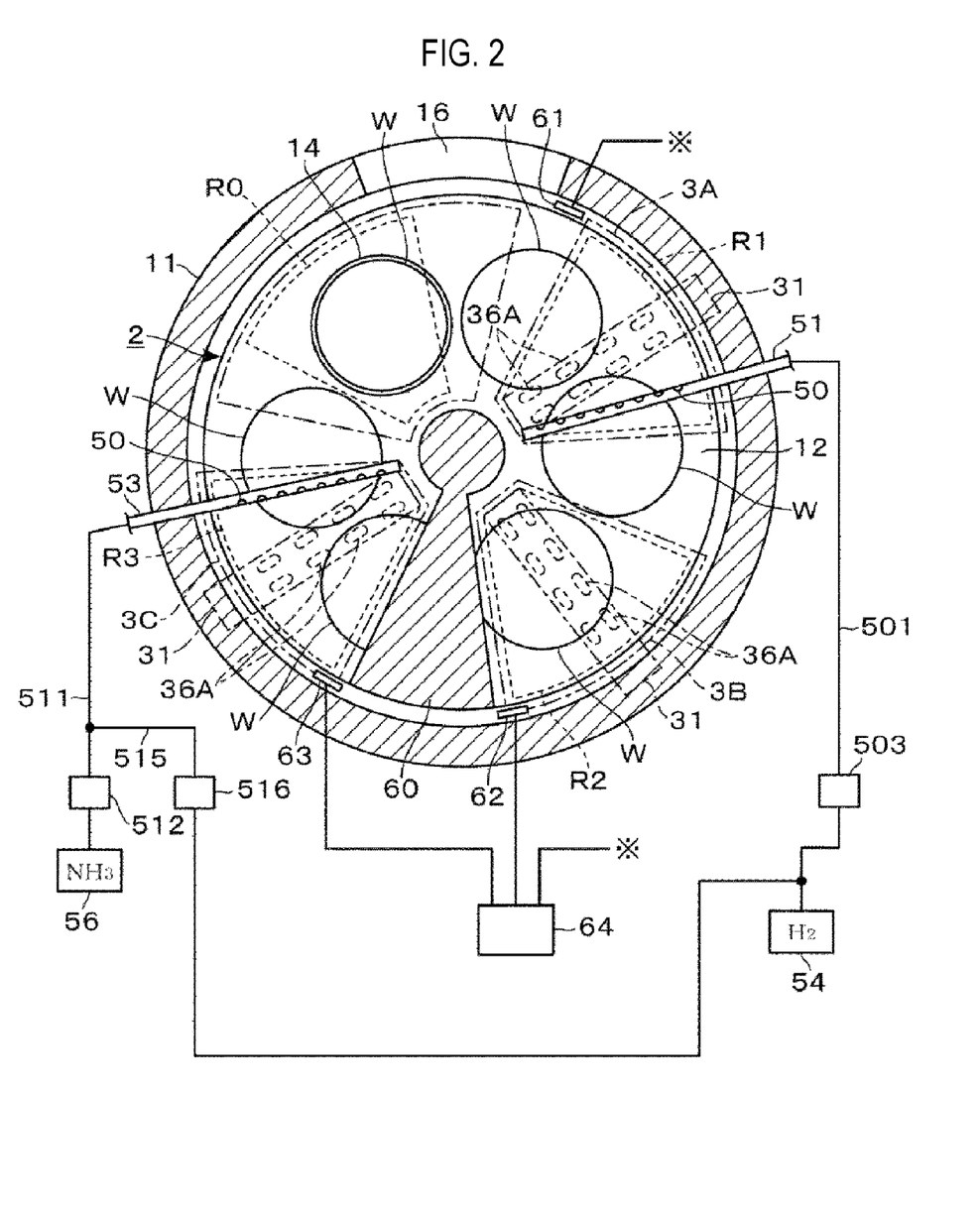
FIG. 2 is a cross-sectional plan view of film forming apparatus.

As shown in FIG. 2, gas injectors 51 and 53 are respectively installed at the downstream end of the plasma generation region R1 and the downstream end of the plasma generation region R3 in the rotational direction of the rotary table 12. The following description will be given with reference to FIG. 6 which is a schematic longitudinal sectional side view taken along the circumferential direction of the film forming apparatus 1. Dotted arrows in FIG. 6 indicate flows of gases discharged from the gas injectors 51 and 53 during the film forming process.

Each of the gas injectors 51 and 53, configured as an elongated tubular body whose distal end side is closed, extends horizontally from the side wall of the vacuum container 11 toward the central region thereof so as to intersect a passage area of the wafer W on the rotary table 12. Each of the gas injectors 51 and 53 has a number of gas discharge ports 50 opened in the horizontal direction along the lengthwise direction thereof. The gas injector 51 discharges a gas to the plasma generation region R1 toward the upstream side thereof when viewed in the rotational direction of the rotary table 12; and the gas injector 53 discharges the gas to the plasma generation region R2 toward the upstream side thereof.

In FIG. 2, reference numeral 501 denotes a pipe connected to the gas injector 51. The upstream side of the pipe 501 is connected to a hydrogen ($H_2$) gas supply source 54 via a gas supply device 503. In FIG. 2, reference numeral 511 denotes a pipe connected to the gas injector 53. The upstream side of the pipe 511 is connected to an $NH_3$ gas supply source 56 via a gas supply device 512. The downstream end of a pipe 515 is connected to the pipe 511 on the downstream side of the gas supply device 512. The upstream end of the pipe 515 is connected to the $H_2$ gas supply source 54 via a gas supply device 516. Therefore, an $H_2$ gas, which is a gas for modifying the SiN film, is discharged from the gas injector 51. An $NH_3$ gas, which is a reaction gas for nitriding the DCS adsorbed on the wafer W, and an $H_2$ gas, which is a modifying gas as described above, are discharged from the gas injector 53.

Figure 6:
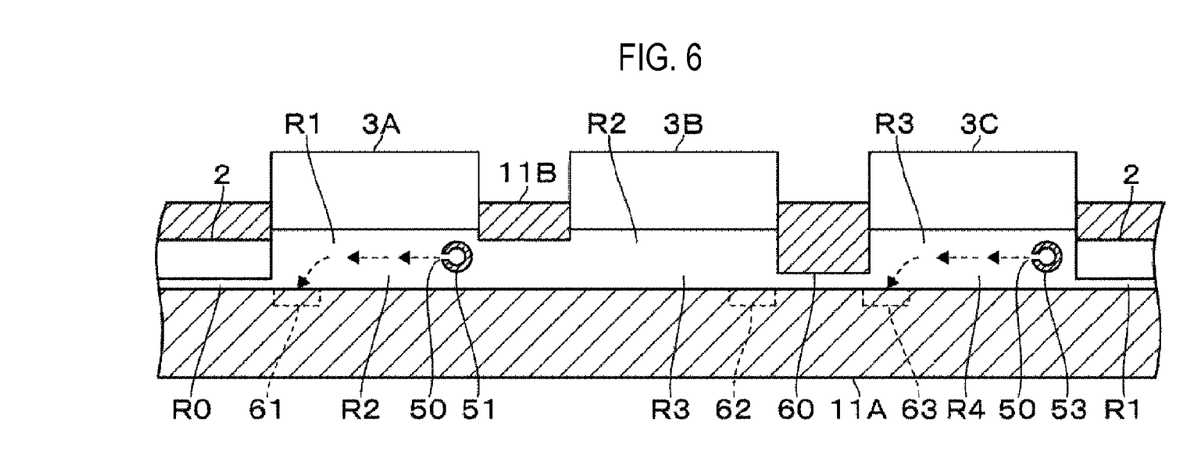
FIG. 6 is a schematic longitudinal sectional side view taken along the circumferential direction of the film forming apparatus.

As shown in FIG. 2, an isolation region 60 is interposed between the plasma generation region R2 and the plasma generation region R3. As shown in FIG. 6, the ceiling surface of the isolation region 60 is set to be lower than the ceiling surfaces of the plasma generation region R2 and the plasma generation region R3. Further, as shown in FIG. 2, the isolation region 60 is formed in a fan shape which becomes wider in the circumferential direction of the rotary table 12 from the central side of the rotary table 12 to the peripheral side thereof when viewed from top, and the lower surface of the isolation region 60 is opposed to and in proximity to the top surface of the rotary table 12 to suppress the conductance between the isolation region 60 and the rotary table 12. This isolation region 60 is provided to prevent the $NH_3$ gas supplied to the downstream side of the isolation region 60 in the rotational direction of the rotary table 12 from being mixed and diluted with the $H_2$ gas supplied to the upstream side of the isolation region 60 in the rotational direction of the rotary table 12.

In addition, as shown in FIG. 2, a first exhaust port 61, a second exhaust port 62 and a third exhaust port 63 are respectively opened at positions facing the upstream end portion of the plasma generation region R1, the downstream end portion of the plasma generation region R2 and the upstream end portion of the plasma generation region R3, which are regions outside the rotary table 12, when viewed in the rotational direction of the rotary table 12. In the figure, reference numeral 64 denotes an exhaust device which is constituted by a vacuum pump or the like and is connected to the first exhaust port 61, the second exhaust port 62 and the third exhaust port 63 via an exhaust pipe. The degree of vacuum inside the vacuum container 11 is adjusted by adjusting an exhaust amount by each of the exhaust ports 61 to 63 with a pressure adjustment part (not shown) installed in the exhaust pipe.

As shown in FIG. 1, the film forming apparatus 1 is provided with a control part 10 which is composed of a computer and stores a program. This program includes a group of steps organized to transmit a control signal to each part of the film forming apparatus 1 to control the operation of each part and to execute a process to be described later. More specifically, the number of revolutions of the rotary table 12 by a rotation mechanism 13, the flow rate and supply/stop of each gas by each gas supply device, the exhaust amount by the exhaust devices 28 and 64, the supply/stop of a microwave from the microwave generator 37 to the antenna 31, the power feeding to the heater 15, and the like are controlled by the program. The control of power feeding to the heater 15 is the control of the temperature of the wafer W and the control of the exhaust amount by the exhaust device 64 is control of the internal pressure of the vacuum container 11. This program is stored in a storage medium such as a hard disk, a compact disk, a DVD, a memory card, etc., and is installed in the control part 10.

Figure 7:
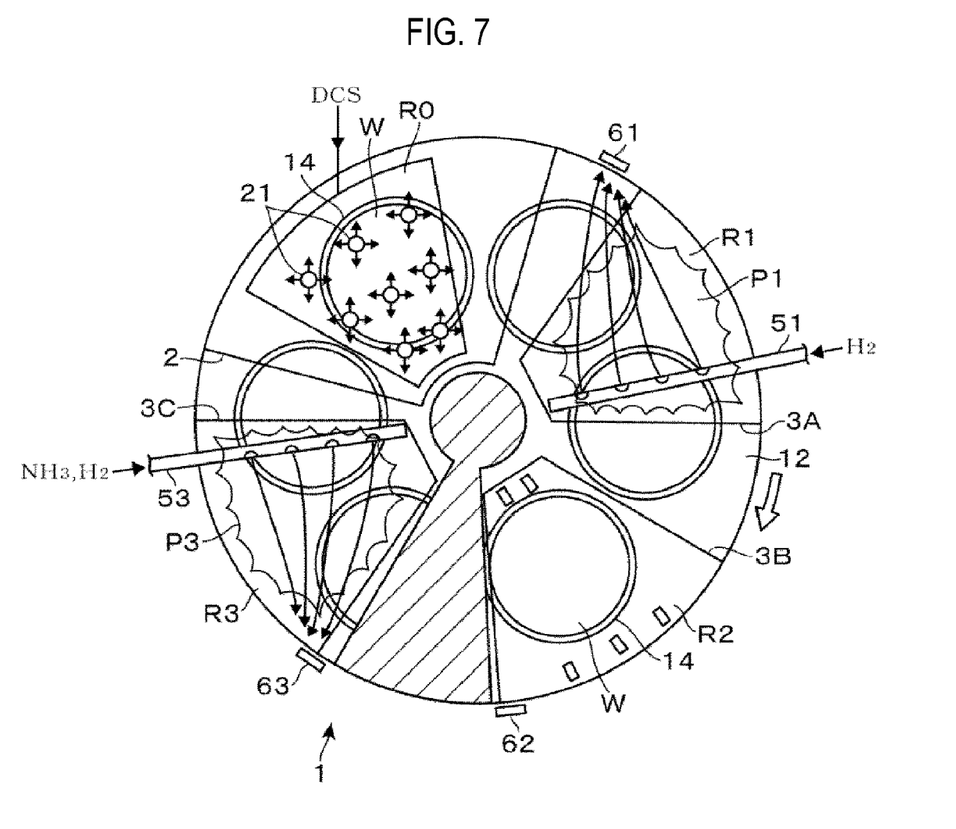
FIG. 7 is a plan view showing the film forming apparatus during film forming process.
Figure 8:
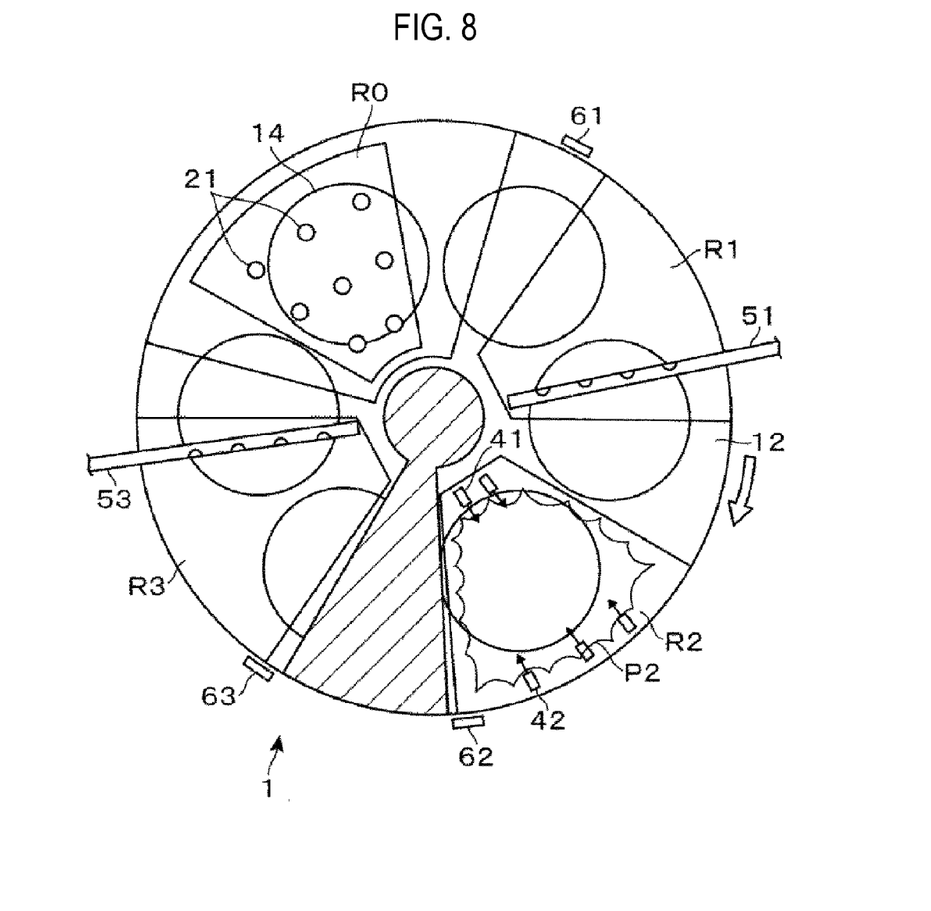
FIG. 8 is a plan view showing the film forming apparatus during a cleaning process.

Hereinafter, a film forming process by the film forming apparatus 1 and a cleaning process will be described with reference to FIGS. 7 and 8 which are explanatory views in which flows of respective gases supplied into the vacuum container 11 are indicated by arrows.

First, six wafers W are delivered by the substrate transfer mechanism to the respective recesses 14 of the rotary table 12 with the ascent and descent of the lift pins as described above. Next, the gate valve installed in the transfer port 16 of the vacuum container 11 is closed to hermetically seal the interior of the vacuum container 11. The wafers W placed in the recesses 14 are heated to, for example, 500 degrees C. or more, more specifically, 550 degrees C., by the heater 15. Then, the interior of the vacuum container 11 is brought into a vacuum atmosphere of a predetermined pressure by the exhaust from the first to third exhaust ports 61, 62 and 63, and the rotary table 12 is rotated clockwise with a predetermined number of revolutions, as indicated by a white arrow.

Then, an $H_2$ gas is supplied from the gas injector 51 to the plasma generation region R1, and an $NH_3$ gas and an gas are supplied from the gas injector 53 to the plasma generation region R3. While each gas is being supplied thus, a microwave is supplied from the microwave generator 37 of the plasma formation units 3A and 3C to the plasma generation regions R1 and R3, respectively. Plasma P1 of the $H_2$ gas is formed in the plasma generation region R1 by this microwave, and plasma P3 of the $H_2$ gas and the $NH_3$ gas is formed in the plasma generation region R3 by this microwave. In the gas supply/exhaust unit 2, a DCS gas is discharged from the gas discharge port 21 and an Ar gas is discharged from the purge gas discharge port 23, while the gases are exhausted from the exhaust port 22. FIG. 7 shows a state in which the gases are supplied to the respective parts and the plasmas P1 and P3 are formed in this way.

When a wafer W is positioned in the adsorption region R0 by the rotation of the rotary table 12, the DCS gas is supplied to and adsorbed on the surface of the wafer W. At the initial stage of rotation of the wafer W, since a portion on which DCS is adsorbed does not react with $NH_3$, it passes through the plasma generation region R1 as it is. When the rotary table 12 is further rotated and the wafer W reaches the plasma generation region R3, DCS adsorbed on the wafer W reacts with $NH_3$ to generate SiN which is a reaction product, and chlorine (Cl) left on the wafer W is removed by active species of hydrogen generated by plasmarization of the $H_2$ gas supplied to the plasma generation region R3.

DCS is adsorbed again in the adsorption region R0 on the wafer W that has passed through the plasma generation region R3, and Cl is removed from a molecular group on the wafer W in the plasma generation region R1.

In this way, the rotation of the rotary table 12 is continued and the wafer W passes through the adsorption region R0, the plasma generation region R1 and the plasma generation region R3 in this order repeatedly multiple times, so that SiN is deposited on the surface of the wafer W to increase the thickness of the SiN film and the modification of the SiN film proceeds. To describe the modification of the SiN film more specifically, chlorine (Cl) derived from the DCS gas contained in the surface of the film is desorbed from the film by the action of the active species of $H_2$ gas, and $NH_3$ is adsorbed at the desorbed portion to nitride Si forming the film, thereby fuming a purer (denser) nitride film. In addition, the DCS gas is adsorbed on the surface (upper surface) of the rotary table 12 in the adsorption region R0 and is exposed to the plasmas P1 and P3, thereby forming a SiN film in the same manner as the surface of the wafer W.

Then, when the thickness of the SiN film reaches a desired size, the discharge and exhaust of each gas in the gas supply/exhaust unit 2 are stopped. On the other hand, the discharge of each gas from the gas injectors 51 and 53 is stopped, the supply of microwave to the plasma generation regions R1 and R3 is stopped, and the formation of the plasmas P1 and P3 is stopped. Thereafter, the gate valve is opened and the wafer W is unloaded out of the vacuum container 11 by the substrate transfer mechanism (not shown).

When such a film forming process is repeated a predetermined number of times, a cleaning process is started in a state in which a wafer W is not loaded into the vacuum container 11. First, the heating of the rotary table 12 by the heater 15 is stopped, and the rotary table 12 is rotated at a predetermined number of revolutions. Thereafter, the $NF_3$ gas is discharged from the nozzles 41 and 42 of the plasma formation unit 3B, and a microwave is applied from the microwave generator 37 of the plasma formation unit 3B to the plasma generation region R2, thereby forming the plasma P2 of $NF_3$ gas in the plasma generation region R2. No plasma is formed in the plasma generation regions R1 and R3. Then, a gas deactivated after plasmarization is removed from each of the exhaust ports 61 to 63. FIG. 8 shows a state in which the gas is supplied to each part and the plasma P2 is formed in the plasma generation region R2.

By being exposed to the plasma P2, the SiN film formed on the surface of the rotary table 12 is removed and the cleaning process proceeds. Since an $NF_3$ gas that is not plasmarized has low activity, the cleaning process is performed only in the plasma generation region R2. When the rotary table 12 is rotated by one or more revolutions from the start of the formation of the plasma P2, thereby removing the SiN film from the entire surface of the rotary table 12, the discharge of the $NF_3$ gas from each of the nozzles 41 and 42 and the supply of microwave to the plasma generation region R2 is stopped and the cleaning process is ended.

Thereafter, a wafer W is newly transferred into the vacuum container 11 and the above-described film forming process of the wafer W is restarted.

Here, the reason why the above-described cleaning process is performed with the $NF_3$ gas plasma formed only in the plasma generation region R2 will be described. When the $NF_3$ gas plasma is formed, F constituting the $NF_3$ gas is doped on the ceiling plate exposed to the plasma by the action of the plasma. Therefore, if the cleaning process is performed by supplying the microwaves to all of the plasma generation regions R1 to R3 to form plasma, F is doped on the ceiling plates of the plasma generation regions R1 to R3. Then, during a film forming process after the cleaning process, when the plasmas P1 and P3 are respectively formed in the plasma generation regions R1 and R3, the F doped on the ceiling plates by the action of the plasma P1 and P3 is supplied to the plasma generation region R1 and R3 and reacts with the $H_2$ gas plasma to become HF. As a result, the modifying action of the SiN film by the $H_2$ gas plasma is weakened to deteriorate the film quality of the SiN film. In addition, even when F is mixed in the SiN film, the film quality is deteriorated. Further, as described above, when Cl of the SiN film reacts with the $H_2$ gas plasma, the adsorption of $NH_3$ on the SiN film is promoted. However, when the $H_2$ gas plasma reacts with F, the $H_2$ gas plasma is caused to become HF instead. This suppresses the adsorption of $NH_3$, thereby decreasing the thickness of the SiN film.

Therefore, as described above, the plasma generation regions R1 and R3, in which plasma is formed during the film forming process but no plasma is formed during the cleaning process, and the plasma generation regions R2, in which no plasma is formed during the film forming process but plasma is formed during the cleaning process, are provided. This can prevent F doped on the ceiling plate of the plasma generation region R2 by the cleaning from being supplied onto the wafer W during the film forming process, thereby preventing the film quality and the film thickness from deteriorating as described above.

As described above, with the film forming apparatus 1, the plasma generation region R2 for cleaning is formed above the rotary table 12 at a position separated in the rotational direction of the rotary table 12 from the plasma generation region R3 for nitridation and the plasma generation region R1 for modification. This can prevent F in a cleaning gas remaining on the ceiling plate of the vacuum container 11 from being mixed in the SiN film formed on the wafer W in the film forming process after the cleaning process or from inhibiting the reaction between Si and $NH_3$. As a result, it is possible to prevent abnormal film thickness and film quality of the SiN film.

Incidentally, since the effect of the modifying action by $H_2$ has temperature dependency, the film quality of the SiN film may be relatively greatly affected when the film forming process is performed on the wafer W at 500 degrees C. or higher. Therefore, in the case where the film forming process is performed at 500 degrees C. or higher, it is particularly effective to perform the cleaning process only in the plasma generation region R2 as described above.

The layout of arrangement in the rotational direction of the rotary table 12 for the plasma generation region R1 for modification of the SiN film the plasmarized $H_2$ gas, the plasma generation region R2 for cleaning and the plasma generation region R3 for plasmarization of the $NH_3$ gas which is an reaction gas is not limited to the above-described example. For example, if the rotary table 12 is rotated clockwise, the plasma generation regions R1, R3 and R2 may be arranged in this order in the rotational direction of the rotary table 12 on the downstream side of the gas supply/exhaust unit 2, or alternatively, the plasma generation regions R2, R1 and R3 may be arranged in this order.

The process performed in the plasma generation region R3 is not limited to nitridation. For example, instead of the $NH_3$ gas, an oxidizing gas such as an oxygen ($O_2$) gas may be discharged from a gas nozzle and may be plasmarized to form a silicon oxide ($SiO_2$) film.

In the above example, the $NF_3$ gas is used as the cleaning gas and the plasma formation unit 3B is used to plasmarize the $NF_3$ gas. However, a chlorine trifluoride ($ClF_3$) gas may be used as the cleaning gas and a cleaning process atmosphere may be heated to, for example, 300 to 500 degrees C. instead of using the plasma formation unit 3B. In this case, the cleaning process is performed while heating the rotary table 12 to 300 to 500 degrees C., achieving the same effect as the above embodiment. Further, when a precursor gas supply region (the adsorption region R0) and a cleaning gas supply region are separated from each other, it is unnecessary to consider corrosion of a material of the gas supply/exhaust unit 2 described above. Therefore, there is an advantage of a high degree of freedom in the selection of the material of the gas supply/exhaust unit 2. Furthermore, in the above example, the cleaning process is performed with the plasmarized $NF_3$ gas on the rotary table 12. However, the present disclosure is not limited to such a cleaning process. For example, the cleaning process may be performed by plasmarizing the $NF_3$ gas by a plasma generation mechanism installed outside the vacuum container 11 and supplying the plasmarized $NF_3$ gas to a region separated in the rotational direction from the plasma formation regions R1 and R3 above the rotary table 12 via a gas supply path connecting the plasma generation mechanism and the vacuum container 11. That is, the cleaning process may be performed by remote plasma.

[Evaluation Tests]

Hereinafter, evaluation tests carried out in connection with present disclosure will be described.

(Evaluation Test 1)

In evaluation test 1, a test was carried out using a comparative apparatus for comparison with the performance of the film forming apparatus of the present disclosure. The comparative apparatus has the following differences in usage from the apparatus of the embodiment shown in FIG. 2 or the like.

During film formation, an $H_2$ gas was also supplied to the plasma generation region R2 and was plasmarized to modify a SiN film.

During cleaning, a cleaning gas was plasmarized in all of the plasma generation regions R1 to R3.

First, in a state where the cleaning process was not performed at all, the film forming process was performed under the following process conditions to obtain a SiN film having a thickness of 21.9 nm.

Process temperature: 450 degrees C., the number of revolutions of the rotary table 12: 20 rpm, process pressure: 266 Pa, flow rate of $H_2$ gas in the plasma generation region R1/R3: 3000/5000 sccm, flow rate of $NH_3$ gas in the plasma generation region R3: 400 sccm, and supply power of the plasma generation region R1/R3: 2500 W.

The flow rate of a DCS gas of the gas supply/exhaust unit 2 was partitioned into three in the radial direction of the rotary table 12, the flow rate was set to increase successively from the central section of the rotary table 12 to the outer section thereof, and the flow rate of the middle one of the three sections was set to 400 sccm. The film forming process time was set such that a target film thickness was 22 nm.

Figure 9:
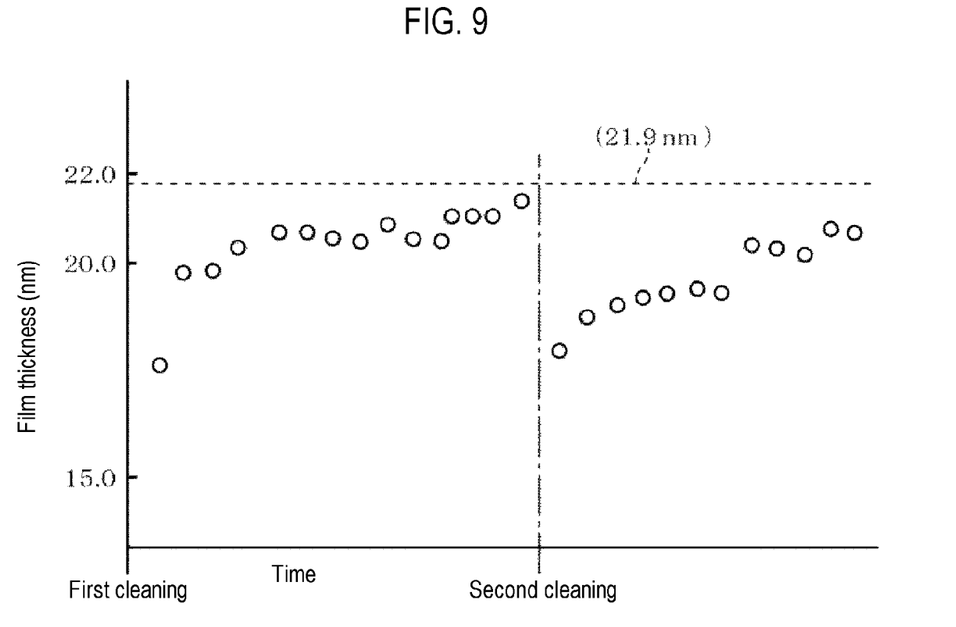
FIG. 9 is a graph showing the results of an evaluation test.

After performing the film forming process, a first cleaning process was performed and then a film forming process was continuously performed. Thereafter, a second cleaning process was performed and then a film forming process was continuously performed. FIG. 9 shows the transition of the thickness of a SiN film in each film forming process. As shown in FIG. 9, the thickness of the SiN film obtained by the first film forming process after the cleaning is small and thereafter gradually increases as the film forming process is repeated. In the evaluation test actually performed, 30 film forming processes were performed following the film forming process positioned at the right end in FIG. 9 and it was grasped that the film thickness was stable around approximately 21.0 nm. Therefore, even when the film forming process is repeated, the thickness of the SiN film obtained by the film forming process after the cleaning is not restored to the thickness of 21.9 nm obtained when the film is formed before the cleaning, but is stable at a film thickness of approximately 1 nm thinner than the target film thickness, even with the above-described process inserted in the middle.

Figure 10:
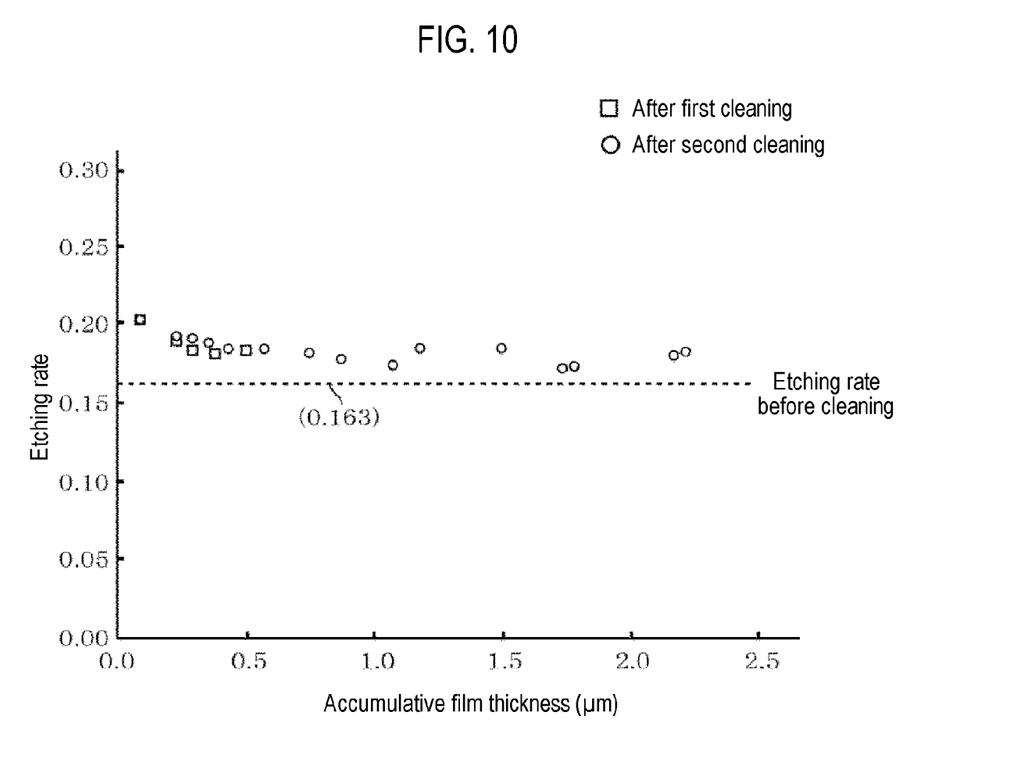
FIG. 10 is a graph showing the results of an evaluation test.

The transition of the quality of the SiN film in each film forming process is shown in FIG. 10. A value normalized based on an etching rate of a predetermined film with respect to an etching rate when the SiN film is immersed in the hydrogen fluoride water of a predetermined concentration is used as an index of the film quality. The etching rate uses an average value of a plurality of predetermined points on the wafer. Therefore, a smaller value on the vertical axis in FIG. 10 indicates a smaller etching rate, which means that the film has higher quality. As can be seen from FIG. 10, the film quality of the SiN film obtained by the film forming process after the cleaning process does not return to the film quality obtained when the film is formed before the cleaning process.

(Evaluation Test 2)

Figure 11:
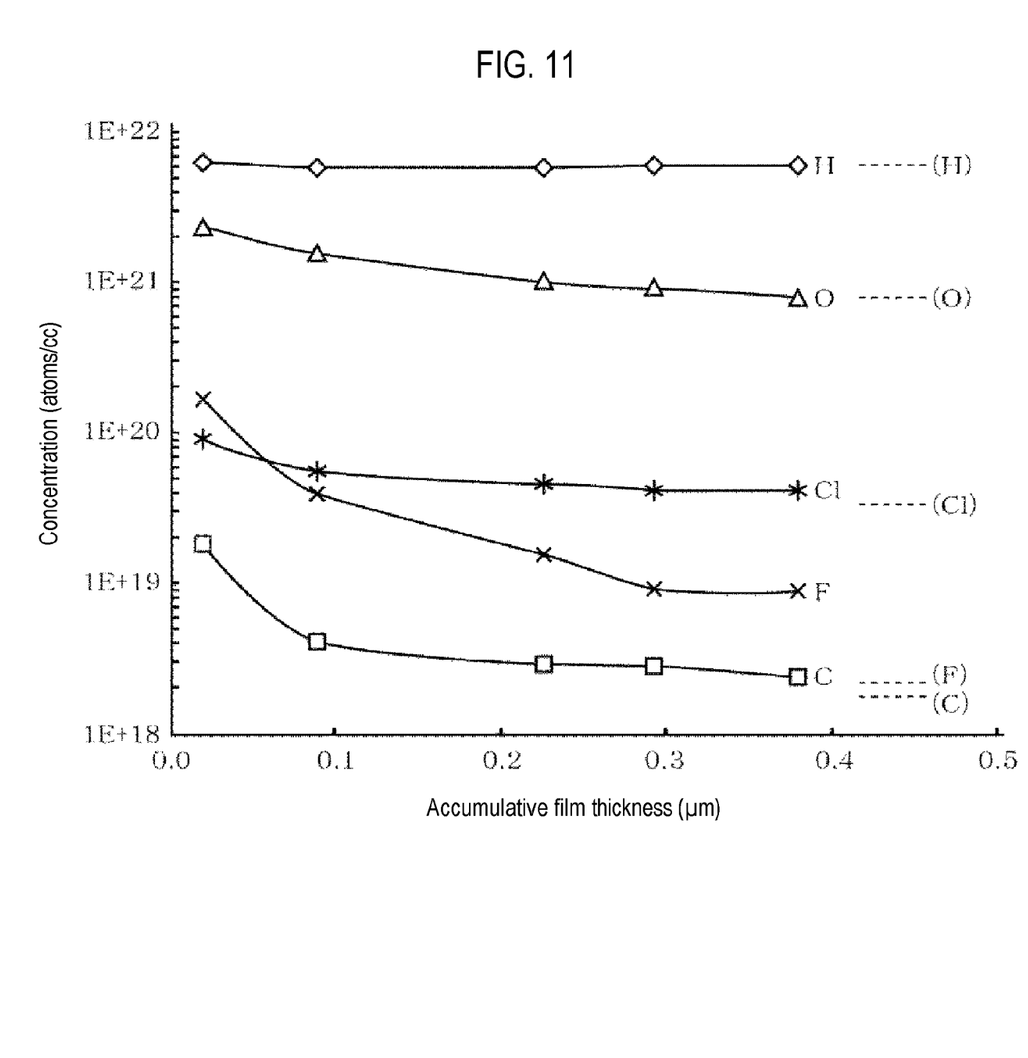
FIG. 11 is a graph showing the results of an evaluation test.

The concentrations of hydrogen (H), oxygen (O), chlorine (Cl), fluorine (F) and carbon (C) in the SiN film obtained by the film forming process after the first cleaning process using the comparative apparatus in an evaluation test 1 were investigated by secondary ion mass spectrometry (SIMS). The results are as shown in FIG. 11. In FIG. 11, a dotted line indicates the concentration of each element in the SiN film obtained by the film forming process before the first cleaning process.

As can be seen from the results, the F concentration in the SiN film obtained by the first film forming process after the cleaning process is considerably higher than the F concentration in the SiN film obtained by the film forming process before the cleaning process. Thereafter, as the number of times of film forming processes is increased, the F concentration in the SiN film is decreased, but it becomes stable at about 4 times the F concentration in the SiN film obtained by the film forming process before the cleaning process. The concentrations of O, Cl and C are also increased by the cleaning process but are thereafter returned to the concentrations before the cleaning process as the number of times of film forming processes is increased.

From the above evaluation tests 1 and 2, when the cleaning process is performed with the plasmarized cleaning gas in the regions R1 to R3 where plasma is generated during the film forming process, it can be seen that the SiN film obtained by the film forming process after the cleaning process has a decreased film thickness, a deteriorated film quality and an increased F concentration.

According to the present disclosure in some embodiments, a cleaning region for supplying a cleaning gas to a rotary table to clean the rotary table and a plasma generation region for generating plasma during a film forming process are separated from each other in the rotational direction of the rotary table. This can prevent components of the cleaning gas adhered to the interior of a vacuum container during the cleaning process from scattering to the process atmosphere by the plasma during the film forming process, thereby suppressing an adverse effect on film formation. Further, since the cleaning region is separated from a precursor gas supply region in the rotational direction, the degree of freedom of the material of a gas supply part for supplying a precursor gas is increased.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a film by revolving a substrate placed on a rotary table in a vacuum container by means of the rotary table, alternately supplying a precursor gas and a reaction gas that reacts with the precursor gas to generate a reaction product multiple times, and depositing the reaction product on the substrate, the film forming apparatus comprising:
   a precursor gas supplier configured to supply the precursor gas onto the substrate in a precursor gas supply region;
   a plurality of plasma generators configured to individually form plasma in each of a plurality of plasma generation regions; and
   a controller configured to control the plurality of plasma generators to form plasma only in a cleaning region among the plurality of plasma generation regions during a cleaning process for cleaning the rotary table,
   wherein the plurality of plasma generation regions include the cleaning region to which a cleaning gas is supplied, and a plasma generation region at which plasma is generated by plasmarizing the reaction gas, and
   wherein the precursor gas supply region and each of the plurality of plasma generation regions are positioned along a circumference of the rotary table, and apart from one another in a rotational direction of the rotary table.

2. The film forming apparatus of claim 1, wherein plasma is generated in at least one of the plurality of plasma generation regions by plasmarizing a modifying gas for modifying the reaction product on the substrate.

3. The film forming apparatus of claim 2, wherein the modifying gas contains a hydrogen gas.

4. The film forming apparatus of claim 1, wherein the precursor gas contains silicon, the reaction gas is a nitrogen-containing gas, and the film formed on the substrate is a silicon nitride film.

5. The film forming apparatus of claim 1, wherein the cleaning region is a region at which the cleaning gas is plasmarized, and a plasmarized cleaning gas is supplied onto a portion of the rotary table.

6. The film forming apparatus of claim 1, wherein the cleaning gas contains fluorine.

7. A method of cleaning a film forming apparatus, comprising:
   forming a film by revolving a substrate placed on a rotary table in a vacuum container by means of the rotary table and repeating multiple times a step of adsorbing a precursor gas on the substrate by supplying the precursor gas onto the substrate in a precursor gas supply region and a step of processing the substrate in a plurality of plasma generation regions, wherein the film comprises a reaction product generated by reaction of the precursor gas and a reaction gas, and the plurality of plasma generation regions include leaning region to which a cleaning gas is supplied, and a plasma generation region at which plasma is generated by plasmarizing the reaction gas; and
   removing the by rotating e rotary table, supplying the cleaning gas to the cleaning region, and forming plasma only in the cleaning region among the plurality of plasma generation regions during a cleaning process for cleaning the rotary table,
   wherein the precursor gas supply region and each of the plurality of plasma generation regions are positioned along a circumference of the rotary table, and apart from one another in a rotational direction of the rotary table.

8. The method of claim 7, wherein plasma is generated in at least one of the plurality of plasma generation regions by plasmarizing a modifying gas for modifying the reaction product on the substrate.

9. The method of claim 7, wherein the cleaning region is a region at which the cleaning gas is plasmarized, and a plasmarized cleaning gas is supplied onto a portion of the rotary table.

10. A non-transitory computer-readable storage medium storing a computer program used for a film forming apparatus for forming a film by revolving a substrate placed on a rotary table in a vacuum container by means of the rotary table, alternately supplying a precursor gas and a reaction gas that reacts with the precursor gas to generate a reaction product multiple times, and depositing the reaction product on the substrate, wherein the computer program includes steps configured to perform the method of claim 7.

* * * * *